(12) United States Patent
Edwards

(10) Patent No.: US 7,652,607 B2
(45) Date of Patent: Jan. 26, 2010

(54) DIGITAL TO ANALOGUE CONVERTERS

(75) Inventor: Martin J. Edwards, Crawley (GB)

(73) Assignee: Chi Mei Optoelectronics Corporation, Tainan (TW)

(*) Notice: Subject to any disclaimer, the term of this patent is extended or adjusted under 35 U.S.C. 154(b) by 511 days.

(21) Appl. No.: 10/599,264

(22) PCT Filed: Mar. 23, 2005

(86) PCT No.: PCT/IB2005/051001

§ 371 (c)(1),
(2), (4) Date: Sep. 25, 2006

(87) PCT Pub. No.: WO2005/093957

PCT Pub. Date: Oct. 6, 2005

(65) Prior Publication Data

US 2009/0140903 A1    Jun. 4, 2009

(30) Foreign Application Priority Data

Mar. 27, 2004  (GB) .................................. 0407010.8

(51) Int. Cl.
*H03M 1/66*  (2006.01)

(52) U.S. Cl. .................. 341/150; 341/144; 341/145
(58) Field of Classification Search ......... 341/144–145, 341/150
See application file for complete search history.

(56) References Cited

U.S. PATENT DOCUMENTS 6,169,508 B1 *  1/2001  Edwards ..................... 341/150
6,556,162 B2 *  4/2003  Brownlow et al. .......... 341/145

* cited by examiner

*Primary Examiner*—Khai M Nguyen
(74) *Attorney, Agent, or Firm*—Fish & Richardson P.C.

(57) ABSTRACT

In a digital to analogue converter, a plurality of digital inputs are used to select one of first and second binary voltage levels as binary inputs (10) to the converter. A capacitor circuit (C, 2C, . . . , 32C) is associated with each input, and these are controlled to output an effective voltage to an output load comprising the first binary voltage level, the second binary voltage level or an average of the first and second binary voltage levels in dependence on the bits of the digital input word. The plurality of capacitor circuits can be operated in either a voltage divider mode (to provide an average output) or a resistor mode depending on the value of the digital data. Operation of the capacitor circuits in this way can result in a reduction in the currents flowing and can therefore reduce the power consumption.

33 Claims, 11 Drawing Sheets

DIGITAL TO ANALOGUE CONVERTERS

This invention relates to digital to analogue converter circuits, and is in particular concerned with the power consumption of such circuits.

Digital to analogue converters based on resistors are well known. Examples of two possible circuits are shown in FIG. 1. The circuit on the right makes use of a set of binary weighted resistors R, 2R, ..., 32R. Data signals, D0 to D5, which represent the bits of the digital data to be converted are applied to one side of the resistors and the other side of the resistors are connected to a common point which forms the output of the converter. D0 represents the least significant bit of the digital data and D5 represents the most significant bit.

The data signals switch between certain discrete voltage levels depending on whether the corresponding bit in the digital data is a 1 or a 0. The output voltage of the circuit varies linearly with the digital data.

The circuit on the left of FIG. 1 avoids the need for a large ratio in the values of the resistors by adopting a ladder network of resistors having a value of R and 2R, as shown. The input data voltages are derived in the same way as for the previous circuit and the output voltage has the same linear dependence on the digital data. Other variations on these resistor based converters are also known.

One advantage of these resistor based converters is that when driving a capacitive load they do not require an output amplifier. Given sufficient time, the output voltage will charge to the value determined by the resistor network and the digital data. The resistive elements in the converters may be formed using real resistors, for example formed from semiconducting or metallic films, or alternatively they can be formed using switched capacitor resistive elements such as that shown in FIG. 2.

The switched capacitor circuit comprises two parallel branches each having first and second switches in series, operated with complementary signals. A capacitor is connected between the junctions between switches of the two branches. The switches are operated cyclically to periodically charge and discharge the capacitor.

As shown in FIG. 2, the equivalent circuit for the switched capacitor circuit is simply a resistor, with a resistance which depends on the capacitance and operating frequency of the circuit.

An advantage of using switched capacitor resistive elements is that it can be easier to control and accurately define the values of capacitors than for resistors. There is also greater flexibility in controlling the values of the resistors since this can be by means of both the capacitor value and the clock frequency.

One of the disadvantages of unbuffered resistor based DAC circuits using either conventional resistors or switched capacitor resistors is that significant current flows between the data voltage sources which drive the inputs to the resistor network. The magnitude of these currents depends on the digital data value, the resistor values and the data voltages. The resistor values are chosen taking into account how much time is available to charge the load capacitance. In applications where the output charging time must be short and therefore the resistor values must be relatively low the power consumed as a result of the current flow between the data voltage sources can be very significant.

There is therefore a need to reduce the power consumption in digital to analogue circuits using switched capacitor resistive circuits.

According to the invention, there is provided a digital to analogue converter comprising:

a plurality of digital inputs corresponding in number to the number of bits of a digital input word, the inputs being used to select one of first and second binary voltage levels as binary inputs to the converter;

a respective capacitor circuit associated with each input;

first and second clock inputs;

an output load; and a plurality of switches controlled by the clock inputs for controlling the coupling of the capacitor circuits either to one of the binary inputs or to the output load, wherein a plurality of the capacitor circuits are controllable to output an effective voltage to the load comprising the first binary voltage level, the second binary voltage level or an average of the first and second binary voltage levels in dependence on the bits of the digital input word.

The invention thus provides a plurality of capacitor (input) circuits which can be operated in either a voltage divider mode (to provide an average output) or a resistor mode depending on the value of the digital data. Operation of the capacitor circuits in this way can result in a substantial reduction in the currents flowing between the data voltage sources and can is therefore significantly reduce the power consumption of the converter circuits. The output resistance of the circuits and therefore their ability to charge a load capacitor is not, however, degraded by the modifications provided by the invention.

Preferably, each capacitor circuit comprises a switched capacitor resistor circuit. For example, each capacitor capacitor circuit may comprise:

a first branch between a first input and the output and comprising first and second switches in series;

a second branch between a second input and the output and comprising third and fourth switches in series;

a capacitor connected between the junction between the first and second switches and the junction between the third and fourth switches.

This defines a switched capacitor circuit which functions as a series resistance, and which has two inputs. By controlling the voltages applied to the two inputs, the circuit can operate essentially as a voltage source and a resistive load or else a voltage divider and a resistive load.

In this circuit, the first and fourth switches are clocked by a first clock signal and the second and third switches are clocked by a second clock signal, although the first and second clock signals can be complementary signals.

Each capacitor circuit may then further comprise a first switching arrangement for supplying a first selected one of the binary voltage levels to the first input and a second switching arrangement for supplying a second selected one of the binary voltage levels to the second input.

In one arrangement, the capacitor circuits are connected in parallel between the plurality of inputs and the capacitive output load. In particular, the capacitor circuits can define a binary weighted configuration of resistors. In this implementation, the capacitor circuit with greatest effective resistance is controlled by the most significant bit of the digital input word, and the other capacitor circuits are each controlled by the most significant bit of the digital input word and one respective other bit of the digital input word. Most of the capacitor circuits thus have two control inputs, one of which is the most significant bit. This arrangement allows the converter to be configured in dependence on the digital data, in such a way as to save power.

In another implementation, the capacitor circuits are connected in parallel between the plurality of inputs and junctions of a resistor ladder, a first end of the resistor ladder being connected to the capacitive output load. This type of converter architecture enables more uniform circuits to be used. In particular, the capacitor circuits can have the same effective resistances.

The capacitor circuit at the second end of the resistor ladder is preferably controlled by the most significant bit of the digital input word, and the other capacitor circuits are each controlled by the most significant bit of the digital input word and one respective other bit of the digital input word.

In either implementation:

the capacitor circuit at the end of the ladder of capacitor circuits opposite to the capacitive load is controlled effectively to output either the first binary voltage level or the second binary voltage level in dependence on the most significant bit; and each of the other capacitor circuits are controlled effectively to output:

either the second binary voltage level or the average of the first and second binary voltage levels when the most significant bit of the digital input word is high, in dependence on the respective other bit; or either the first binary voltage level or the average of the first and second binary voltage levels when the most significant bit of the digital input word is low, in dependence on the respective other bit.

In a circuit which reduces the number of switches required, each of the capacitor circuits can comprise an input switch and an output switch in series between one of the binary inputs and the output load, and further comprising a capacitor connected between the junction between the input switch and output switch and a common terminal.

In a further modification, each of the capacitor circuits can comprise an input switch and an output switch in series between a first power line and a second power line, wherein the first power line is selectively connected to the first binary voltage level and the second power line is selectively connected to the second binary voltage level, and further comprising a capacitor connected between the junction between the input switch and output switch and a common terminal. The input switches are each controlled by a respective digital input and the output switches are each controlled by the complement of the respective digital input. This arrangement reduces the number of switches controlled by the clock inputs.

The invention also provides a method of performing digital to analogue conversion, comprising:

using the bits of a digital input word to generate a plurality of control voltages corresponding in number to the number of bits, one control voltage comprising a first binary voltage level or a second binary voltage level, and each other control voltage comprising a first binary voltage level, a second binary voltage level or an average of the first and second binary voltage levels; and using the plurality of control voltages to drive an output load.

This method preferably uses switched capacitor resistor circuits, as used in the converter circuit of the invention.

The invention also provides a display device (for example a liquid crystal display) in which the digital to analogue converter of the invention is used in the column address circuitry.

Examples of the invention will now be described in detail with reference to the accompanying drawings, in which.

The invention uses capacitive circuits which effectively output one of two binary voltage levels or else an average of the two binary voltage levels. By controlling the operation of these capacitor circuits in dependence on the digital data, the power consumption of the circuit can be reduced. In the preferred implementation, the invention uses modified switched capacitor circuits as the capacitor circuits.

Figure 2:
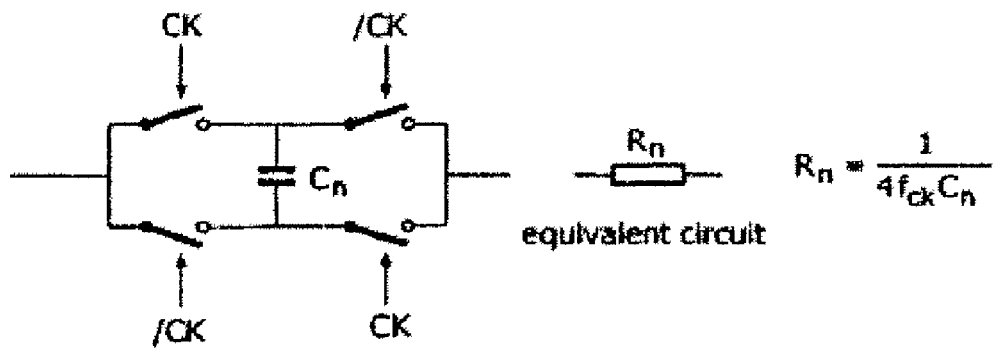
FIG. 2 shows a known switched capacitor circuit for simulating a resistor.
Figure 3:
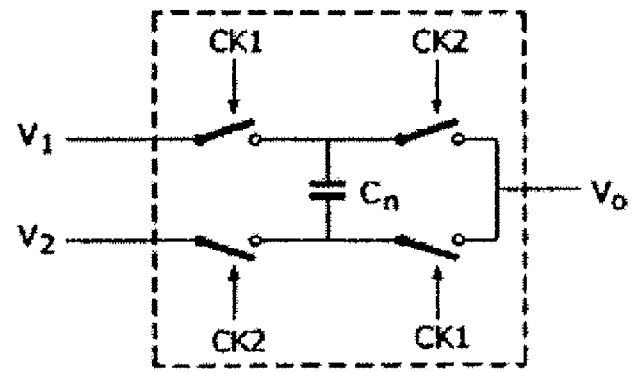
FIG. 3 shows a switched capacitor circuit of the invention and forming the building block of digital to analogue converter circuits of the invention.

The way in which the switched capacitor resistor circuit of FIG. 2 can be modified to form a known voltage divider circuit is shown in FIG. 3.

The switched capacitor circuit again a first branch connected to a first input $V_1$ and a second branch connected to a second input $V_2$. The capacitor $C_n$ is again connected between the junctions between the switches in each branch. As shown, the switch on the input side of one branch is clocked synchronously with the switch on the output side of the other branch (CK1) and vice versa (CK2). These signals CK1 and CK2 may again be complementary signals.

When the output of the circuit of FIG. 3 is connected to a capacitive load, the output voltage $V_o$ will settle at the mean value of the two input voltages $V_1$ and $V_2$. An important feature of this circuit is that when the current flowing at the output terminal is zero, which occurs when the output voltage is at the mean of $V_1$ and $V_2$, the current flowing at the two input terminals is also zero.

It is possible to switch the circuit of FIG. 3 between operation as a resistor and operation as a voltage divider by controlling the voltages at the two inputs.

Figure 4:
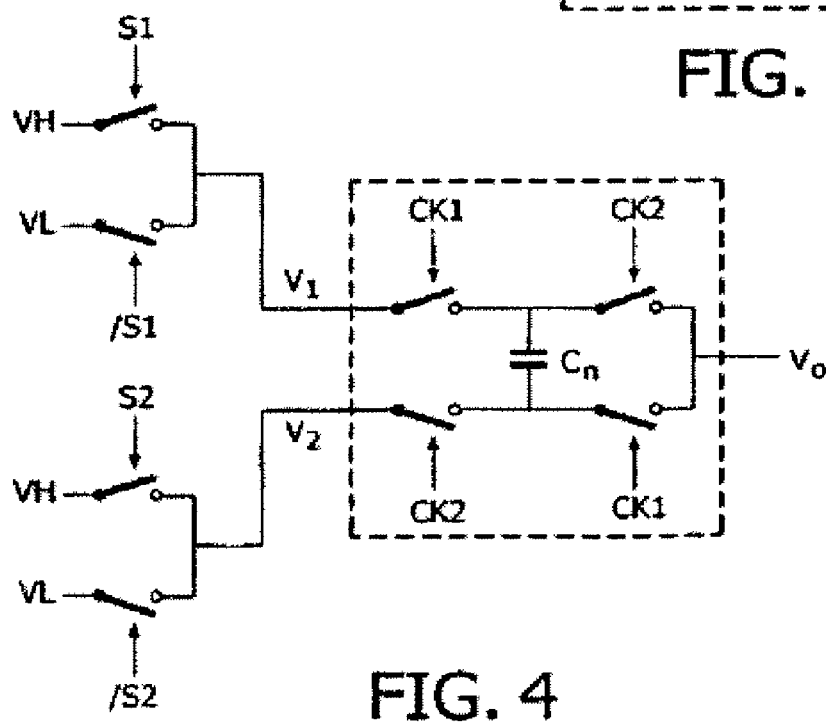
FIG. 4 shows how the circuit of FIG. 3 can be controlled.

The circuit of FIG. 4 illustrates one way in which this can be achieved. A first switching arrangement comprising the switches controlled by S1 and /S1 is provided for supplying a first selected one of the binary voltage levels VL and VH to the first input $V_1$. A second switching arrangement comprising the switches controlled by S2 and /S2 is provided for supplying a second selected one of the binary voltage levels to the second input $V_2$.

The same result could also be achieved with other circuit implementations.

The binary voltage signals VH and VL represent the two possible data voltage levels. These reference voltages determine the output voltage range of the digital to analogue converter and might be the same as the digital signal levels, for example 0V and 3.3V, or they might represent a pair of reference voltage levels selected from a set of reference voltage levels in the case where the converter is to implement a piecewise linear approximation to a non-linear characteristic using known techniques.

The digital control signals S1 and S2 and their complements /S1 and /S2 operate the switches to connect one of the two reference voltages to each of the two inputs of the switched capacitor circuits. The way the control signals are derived from the digital data is illustrated below.

The behaviour of the circuit for different states of S1 and S2 is summarised in Table 1 below. The output voltage represents the voltage that would be generated on a capacitive load when charging is complete and the output current is zero. The output resistance is the effective output resistance of the circuit. This output voltage can be considered as an "effective output voltage", and this term should be understood accordingly in this description and claims.

TABLE 1

| S1 | S2 | V1 | V2 | Output voltage | Output resistance |
|----|----|----|----|----------------|-------------------|
| 0 | 0 | VL | VL | VL | $R_o = 1/(4 f_{CK} C_n)$ |
| 0 | 1 | VL | VH | 0.5(VH + VL) | $R_o = 1/(4 f_{CK} C_n)$ |
| 1 | 0 | VH | VL | 0.5(VH + VL) | $R_o = 1/(4 f_{CK} C_n)$ |
| 1 | 1 | VH | VH | VH | $R_o = 1/(4 f_{CK} C_n)$ |

The output behaviour of the circuit of FIG. 4 can be summarised as follows. When S1 and S2 are low, so that both $V_1$ and $V_2$ are set to VL, the output of the circuit is equivalent to a resistor having a value $R_o$ connected between the output terminal and the reference voltage VL. When S1 and S2 are high, so that both $V_1$ and $V_2$ are set to VH, the output of the circuit is equivalent to a resistor having a value $R_o$ connected between the output terminal and the reference voltage VH. When S1 and S2 have different states and one of $V_1$ or $V_2$ is at VH and the other is at VL then the output of the circuit is equivalent to a resistor having a value of $R_o$ connected between the output terminal and a voltage source equal to the mean value of VH and VL.

Figure 5:
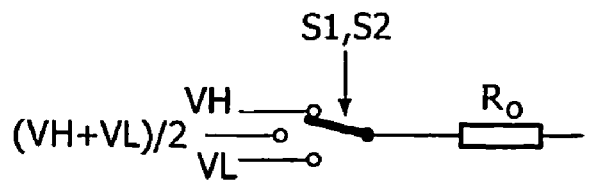
FIG. 5 is a schematic representation of the circuit of FIG. 4.

An equivalent circuit which represents the output characteristics of the circuit of FIG. 4 is shown in FIG. 5. As shown, the circuit has two control inputs which switch the circuit between three possible operating modes.

This circuit can be used as a building block, optionally in combination with additional resistor elements, to form a digital to analogue converter.

Figure 6:
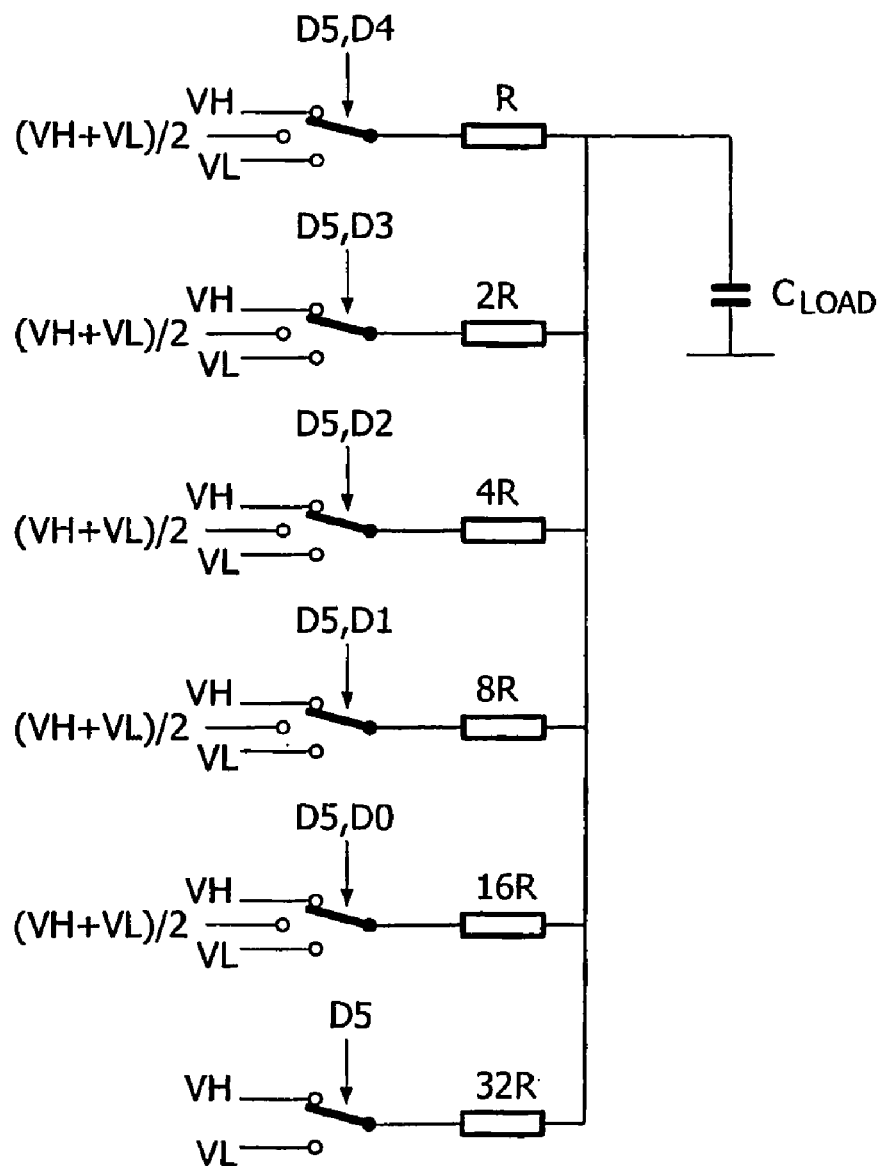
FIG. 6 shows a first digital to analogue converter circuit of the invention.

A first example of a possible circuit is shown in FIG. 6.

Figure 1:
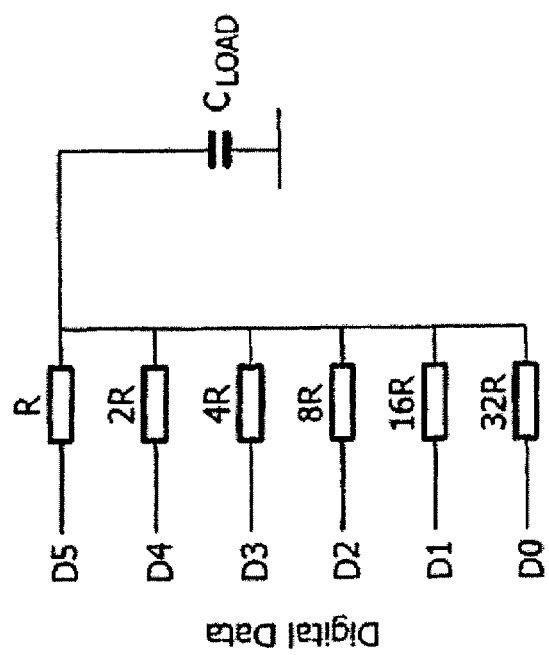
FIG. 1 shows two known digital to analogue converter circuits.
Figure 1:
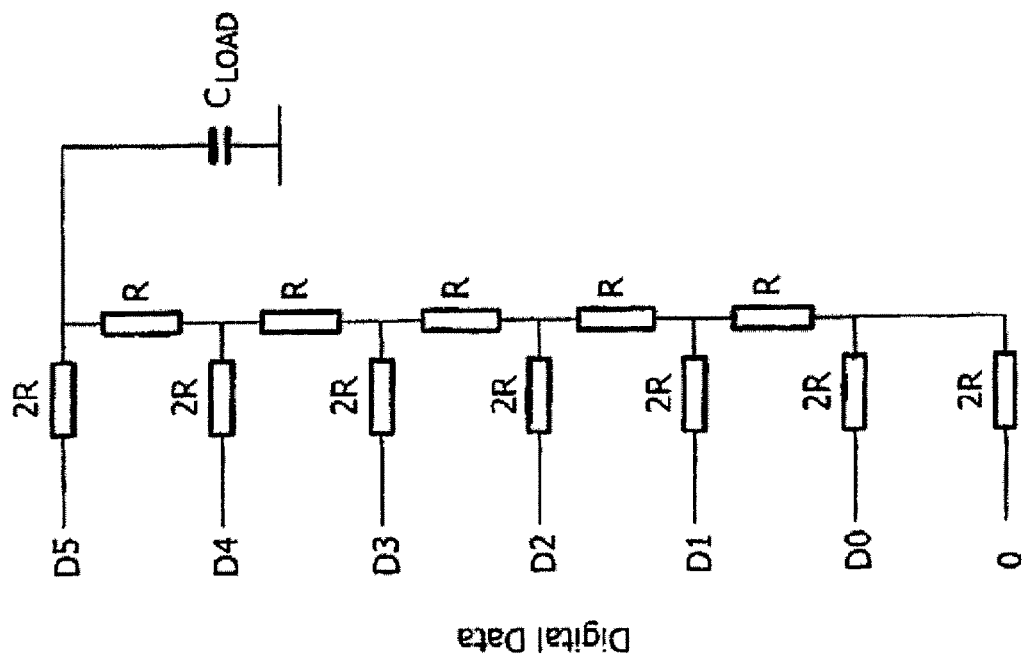

The operation of the circuit of FIG. 6 is clearly similar to the operation of the circuit on the right of FIG. 1.

The circuit of FIG. 6 generates an output voltage which varies linearly with the 6-bit digital data defined by the data bits D0 through to D5, where D0 is the least significant bit and D5 is the most significant bit. The output voltage varies between a voltage VL, corresponding to a code of 000000 and VH corresponding to a code of 111111.

The circuits consists of six of the modified switched capacitor resistor/divider circuits connected in parallel between the plurality of inputs and the capacitive output load. The output resistance values increase by a factor of two for successive data bits of lower significance, to provide a binary weighted circuit configuration.

The sixth capacitor circuit with greatest effective resistance 32R is controlled only by the most significant bit D5 of the digital input word, and the other capacitor circuits are each controlled by the most significant bit of the digital input word D5 and one respective other bit D0, D1, D2, D3 or D4 of the digital input word.

The sixth capacitor circuit with greatest effective resistance 32R is thus controlled effectively to output either the first binary voltage level VL or the second binary voltage level VH in dependence on the most significant bit and does not operate in the intermediate voltage dividing mode.

When the most significant bit D5 is high, each of the other capacitor circuits is controlled effectively to output the high binary voltage level VH or else the average voltage level (VL+VH)/2. When the most significant bit D5 is low, each of the other capacitor circuits is controlled effectively to output the low voltage level VL or else the average voltage level (VL+VH)/2.

The sixth capacitor circuit has a resistance value which is twice that of the modified switch capacitor resistor/divider circuit associated with the least significant bit D0 of data. This circuit arrangement ensures a linear relationship between the digital input and the analogue output.

Figure 7:
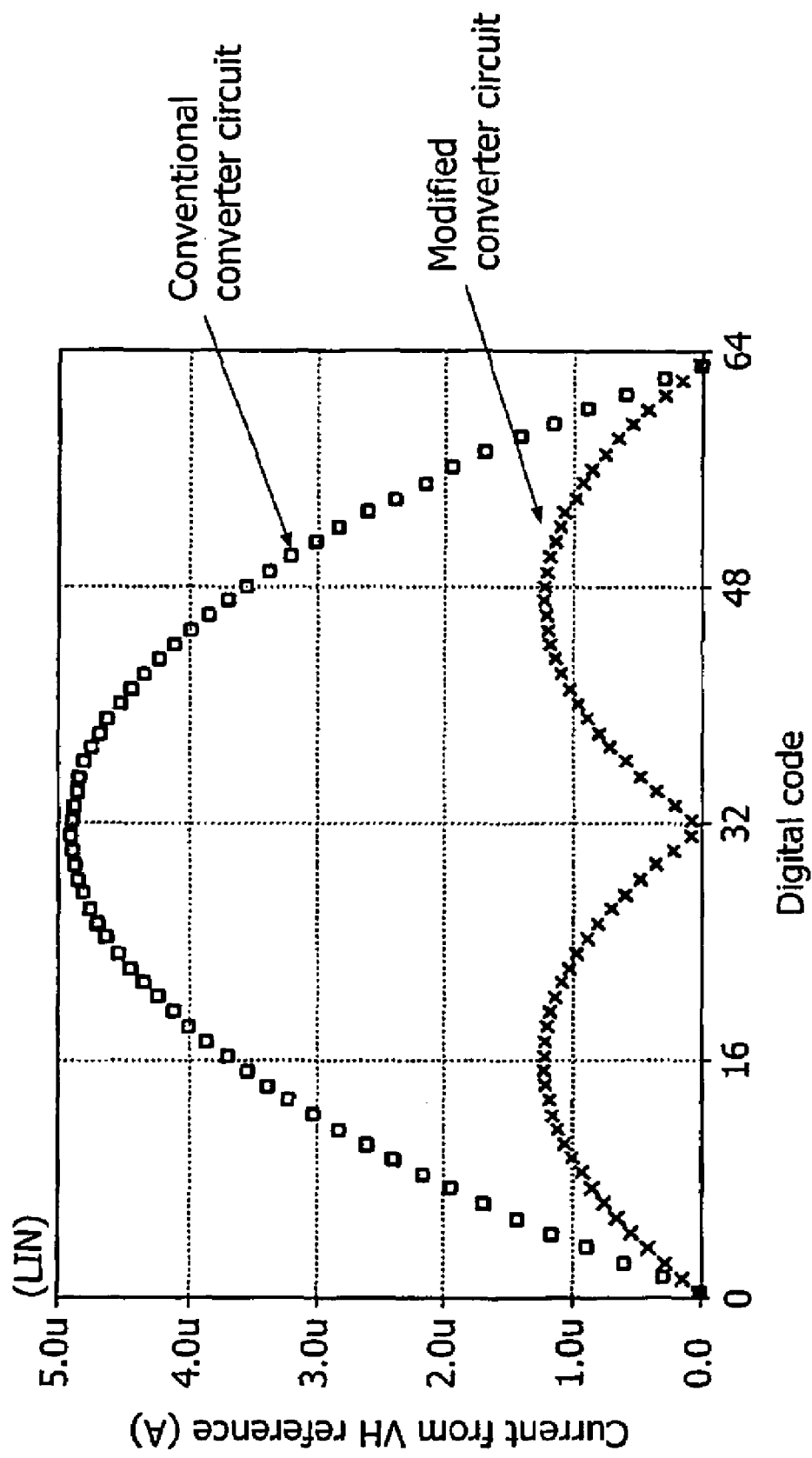
FIG. 7 is used to explain the response of the circuit of FIG. 6.

An important advantage of this new converter circuit compared to the corresponding conventional circuit shown on the right of FIG. 1 is that the static power consumption is substantially reduced without changing the output resistance. The way in which the average current drawn from the VH reference voltage source varies with digital code is shown in FIG. 7 for the conventional circuit and for the modified circuit of FIG. 6.

This current is the value which flows between the reference voltage sources when the voltage on the load capacitor has settled at the final value. The value of the largest capacitor in both circuits is 1 pF, corresponding to the switched capacitor resistor having the lowest resistance, and the clock frequency is 50 kHz. This results in both circuits having an output resistance of 2.54 MΩ. The reference voltages have values of 0V for VL and 5V for VH. The maximum value of the current in the case of the conventional circuit is 4.92 µA and occurs for digital codes of 31 and 32. For the modified circuit the maximum current is 1.23 µA and occurs for digital codes of 16 and 47. The peak current is therefore reduced by a factor of 4 in the new circuit leading to a factor of 4 reduction in the power consumption. The average current considering all code values is 3.23 µA for the conventional circuit and 807 nA for the modified circuit which is also reduced by a factor of 4.

This reduction in current flow between the reference voltage sources results from two factors. The first is that the effective voltage appearing across the modified switched capacitor resistor elements when they are acting as voltage divider circuits is lower than that across the equivalent switched capacitor resistor elements in the conventional circuit. Secondly, current which flows into or out of the switched capacitor resistor elements when they are acting as voltage divider circuits is divided equally between the two reference voltage input terminals of the resistor. This current tends to cancel the current flowing in the modified switched capacitor resistor circuits which are acting as resistors and therefore reduces the magnitude of the current supplied by the reference voltage source.

Figure 8:
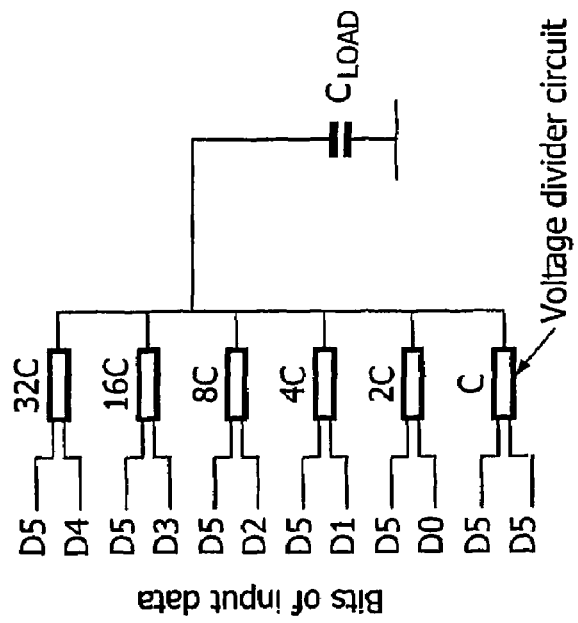
FIG. 8 shows the connection of control lines to the circuit of FIG. 6.

The circuit can be implemented quite simply by applying the individual bits of the input data to the inputs of voltage divider circuits as illustrated in FIG. 8. The digital inputs D0-D5 act as the switch control signals S1 and S2 of FIG. 4. The power supply lines for VH and VL are not shown in FIG. 8, and these will be supplied to each capacitor circuit C, 2C, . . . , 32C.

The invention can also be used to form a circuit operating in a manner corresponding to the operation of the circuit on the left of FIG. 1, based on an R2R ladder network.

Figure 9:
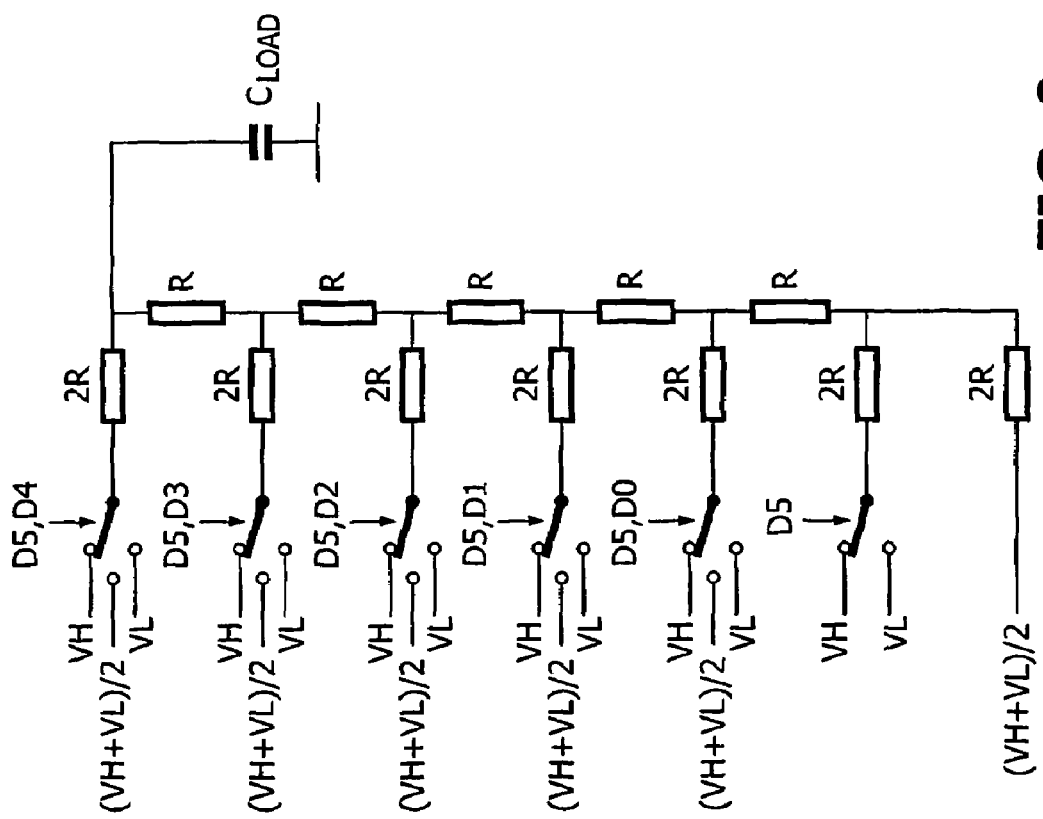
FIG. 9 shows a second digital to analogue converter circuit of the invention.

FIG. 9 shows this second converter circuit of the invention. The capacitor circuits are connected in parallel between the inputs and junctions of a resistor chain made up from resistors R. One end of the resistor ladder is connected to the capacitive output load, and the other end is connected to a circuit controlled by the most significant bit D5, as in the circuit above. This end of the resistor chain is also provided with the average of the first and second binary voltage levels VL, VH through a further capacitor circuit. All of the capacitor circuits have the same effective resistance 2R, which is double the resistance of the resistors R in the chain.

As in the circuit of FIG. 6, when the most significant bit D5 is high, each of the other capacitor circuits is controlled effectively to output the high level VH or else the average voltage level (VL+VH)/2. When the most significant bit D5 is low, each of the other capacitor circuits is controlled effectively to output the low voltage levels VL or else the average voltage level (VL+VH)/2.

Figure 10:
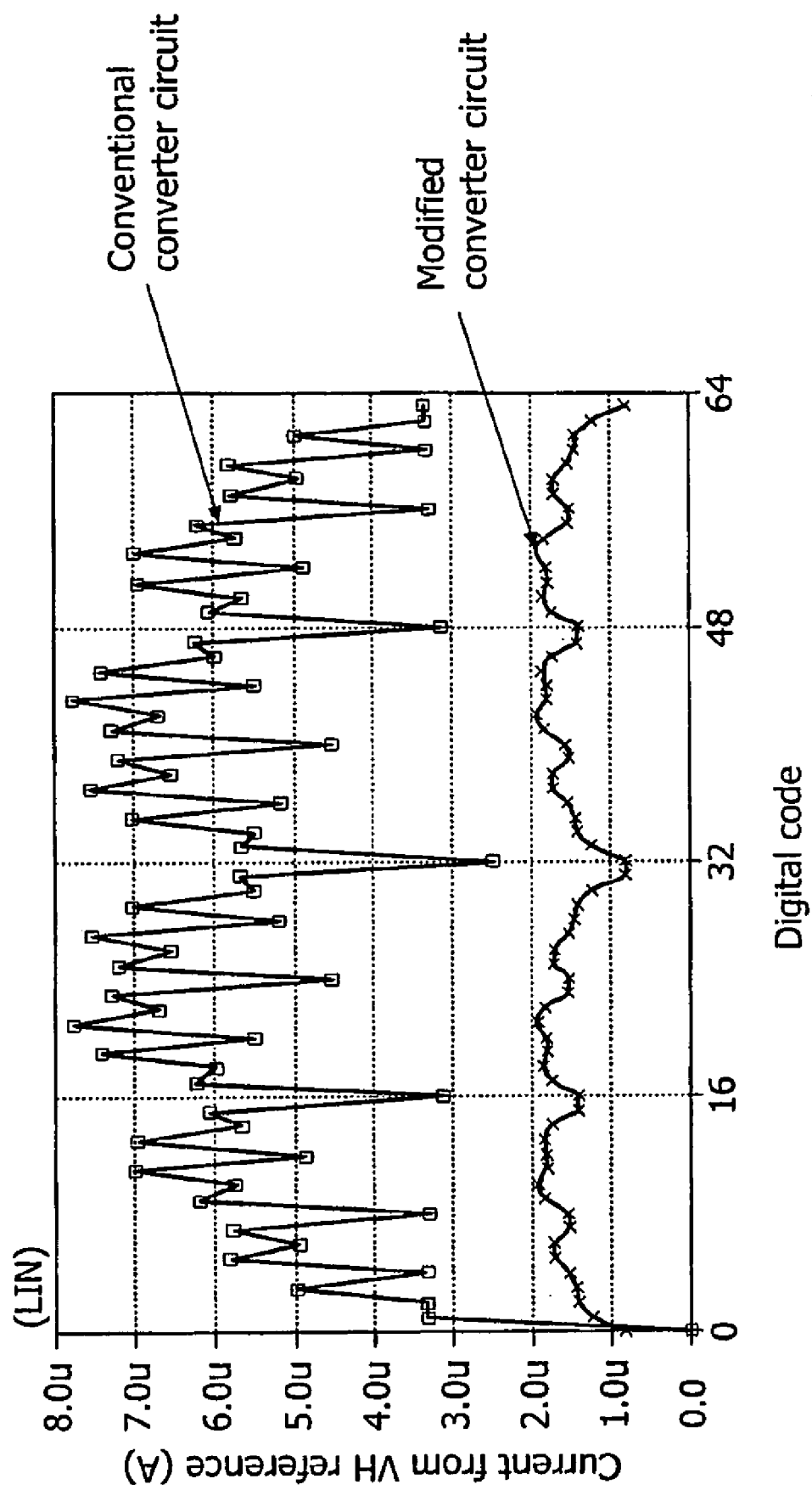
FIG. 10 is used to explain the response of the circuit of FIG. 9.

The current supplied from the VH voltage reference for the circuit of FIG. 9 and for the conventional circuit shown on the left of FIG. 1 is shown in FIG. 10.

The value of the largest capacitor in both circuits is 1 pF, corresponding to the switched capacitor resistor having the lowest resistance, and the clock frequency is 50 kHz. This results in both circuits having an output resistance of 5MΩ. The reference voltages have values of 0V for VL and 5V for VH. The maximum value of the current in the case of the conventional circuit is 7.766 µA and occurs for digital codes of 21 and 43. For the modified circuit the maximum current is 1.942 µA and occurs for digital codes of 21 and 42. The peak current is therefore again reduced by a factor of 4 in the new circuit leading to a factor of 4 reduction in the power consumption. The average current considering all code values is 5.53 µA for the conventional circuit and 1.58 µA for the modified circuit which is reduced by a factor of 3.5.

Improvements can be made to the circuits described above while maintaining the same functionality. In particular, the complexity and power consumption can be further reduced.

Figure 11:
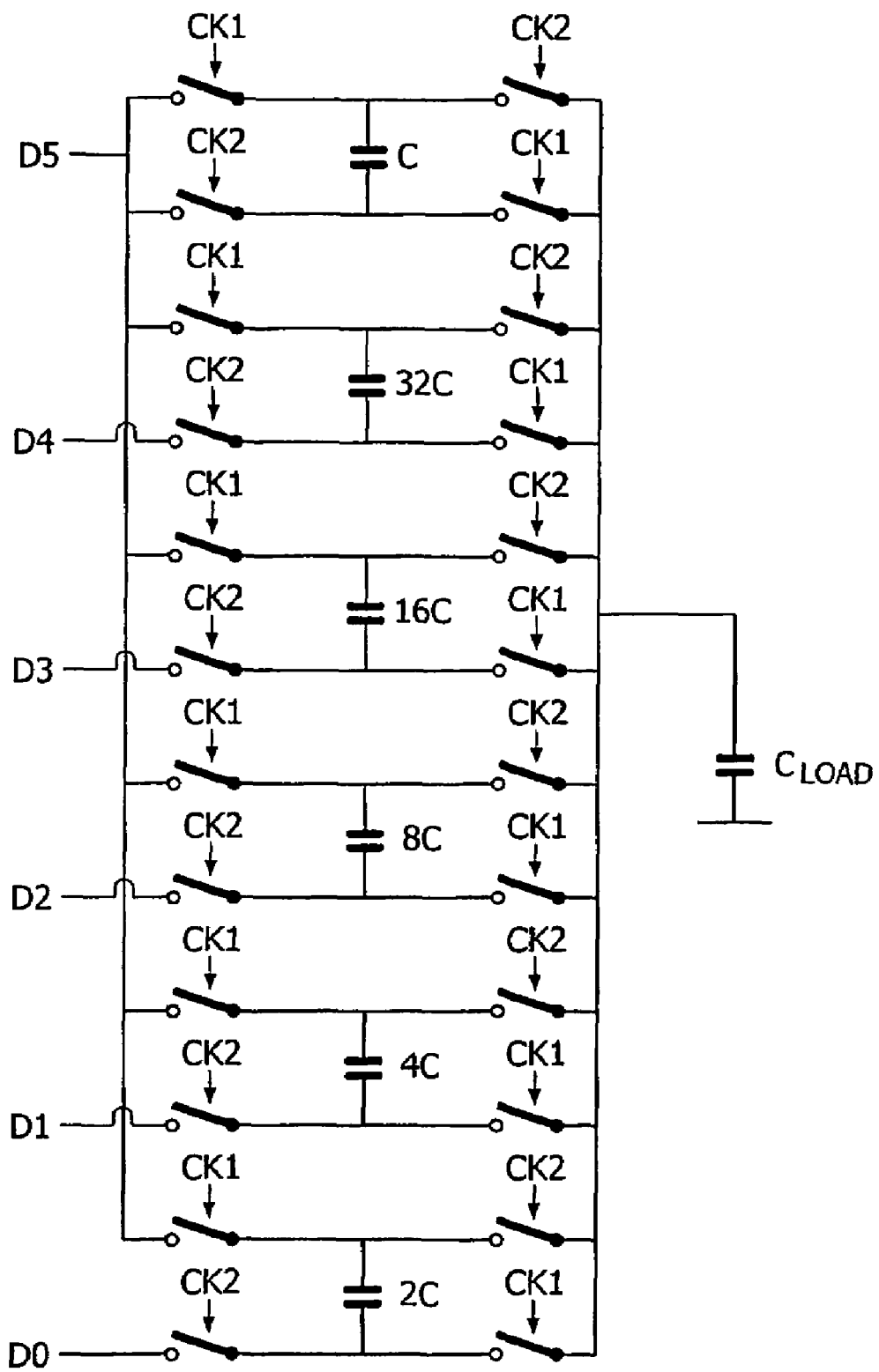
FIG. 11 shows in more detail the circuit elements which make up the circuit of FIG. 8.

FIG. 11 shows in more detail the circuit elements which make up the circuit of FIG. 8. For each bit of the input digital data four switches and one capacitor are required to form the capacitor circuit for each input bit. The total number of switches is therefore 4N, where N is the number of bits.

Part of the circuitry associated with each bit of the digital data is the same for each bit. For each circuit, there is a first switch connected between the input data bit D5 and the first terminal of the capacitor and there is a second switch connected between this first terminal of the capacitor and the output of the circuit. This part of the circuitry is the same in each capacitor circuit so that the first terminal of each capacitor in each capacitor circuit can be joined to a common point without affecting the operating principles of the circuit.

Figure 12:
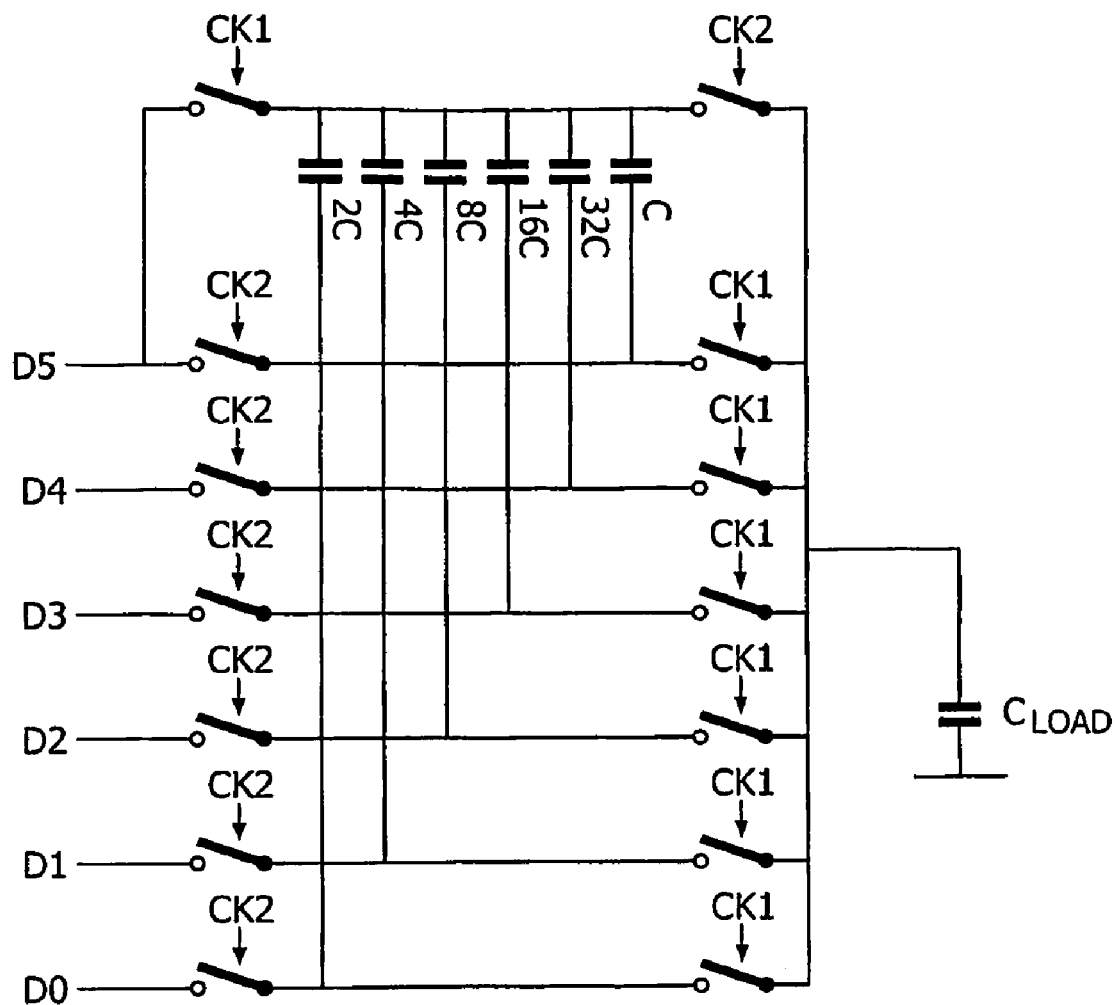
FIG. 12 shows a third digital to analogue converter circuit of the invention.

FIG. 12 shows this modified circuit, which provides the advantage that the number of switches operating at the clock frequency required to form the converter circuit is reduced. The number of switches required to form the converter is reduced from 4N to 2N+2.

In this arrangement, each bit, other than the highest bit, is associated with only one input switch (CK2) and one output switch (CK1). Between the input and output switch, a connection is made to one terminal of the associated capacitor. The highest bit, D5 in this example, is associated with two input switches and two output switches. The capacitors are all connected between at their other terminal to a common point, which is between one input switch and one output switch of the circuit associated with the highest bit.

In more detail, each input D0-D5 is associated with circuits having an input switch (each clocked by CK2) and an output switch (each clocked by CK1) in series between the binary input and the output load. An associated capacitor is connected between the junction between the input switch and output switch and the common terminal. The most significant bit of the binary input word, D5, is associated with an additional input switch (clocked by CK1) and an additional output switch (clocked by CK2) in series between the most significant binary input and the output load. The common terminal is defined at the junction between the additional input switch and the additional output switch. The circuit of FIG. 12 has exactly the same functionality as the circuit of FIG. 11 and is topologically identical.

One disadvantage of the circuit of FIG. 12 is that there is still a relatively large number of switches which are controlled by clock signals CK1 and CK2. These clock signals switch at a higher frequency than the bits of the digital data and the power required to operate these switches may make a significant contribution to the overall power consumption of the converter circuit.

Figure 13:
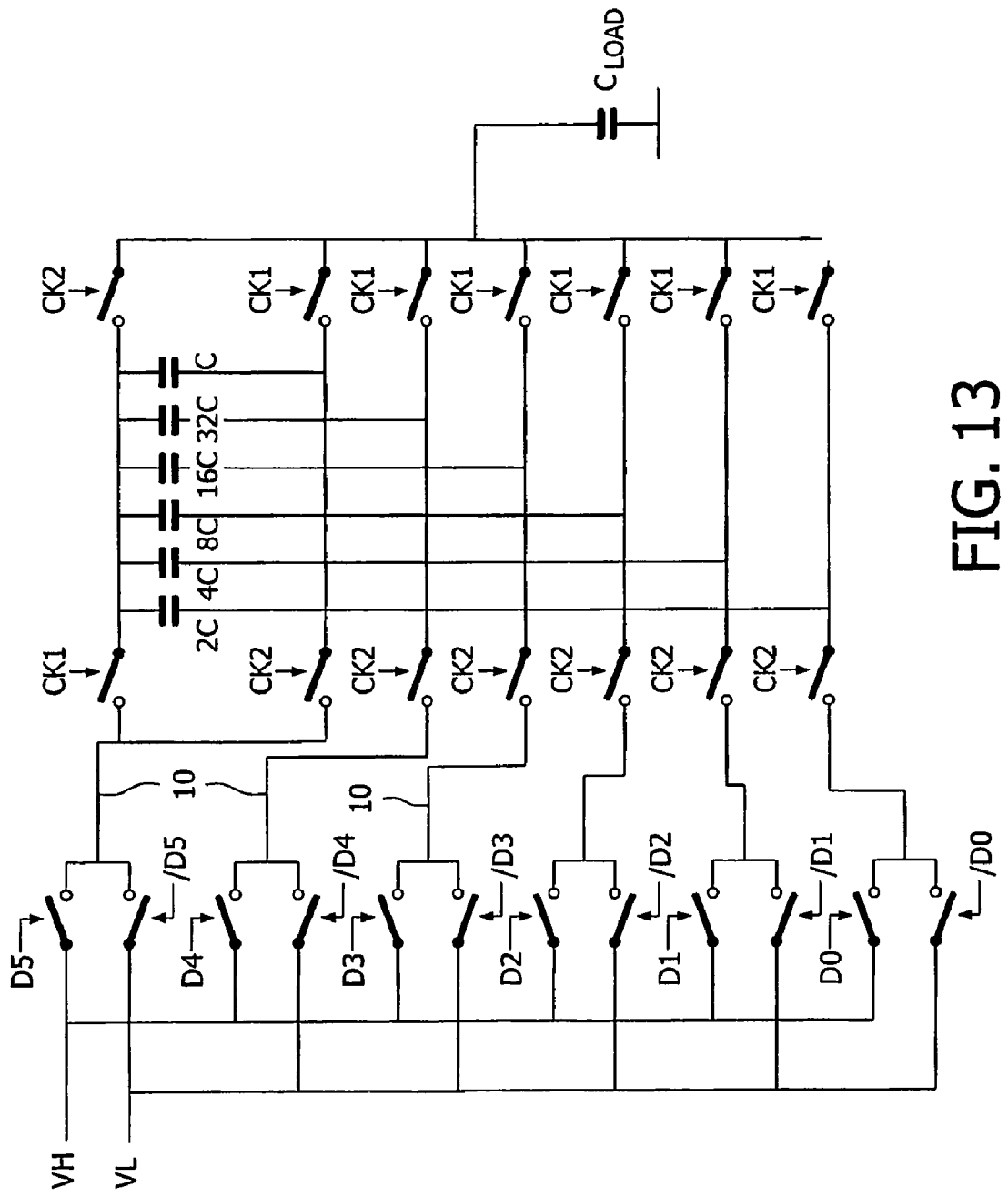
FIG. 13 shows the converter of FIG. 12 with the input switches.

FIG. 13 shows the full circuit of FIG. 12 including the switches which couple the binary voltage levels VH and VL to the circuit. In this circuit, each input 10 is connected to two switches, a first which connects the input to a voltage level VH and a second which connects the input to a voltage level VL.

It is possible to reduce the number of switches which must be clocked (to save power) by modifying the circuit further, particularly the way in which the binary voltages levels VH and VL are coupled to the circuit.

Figure 14:
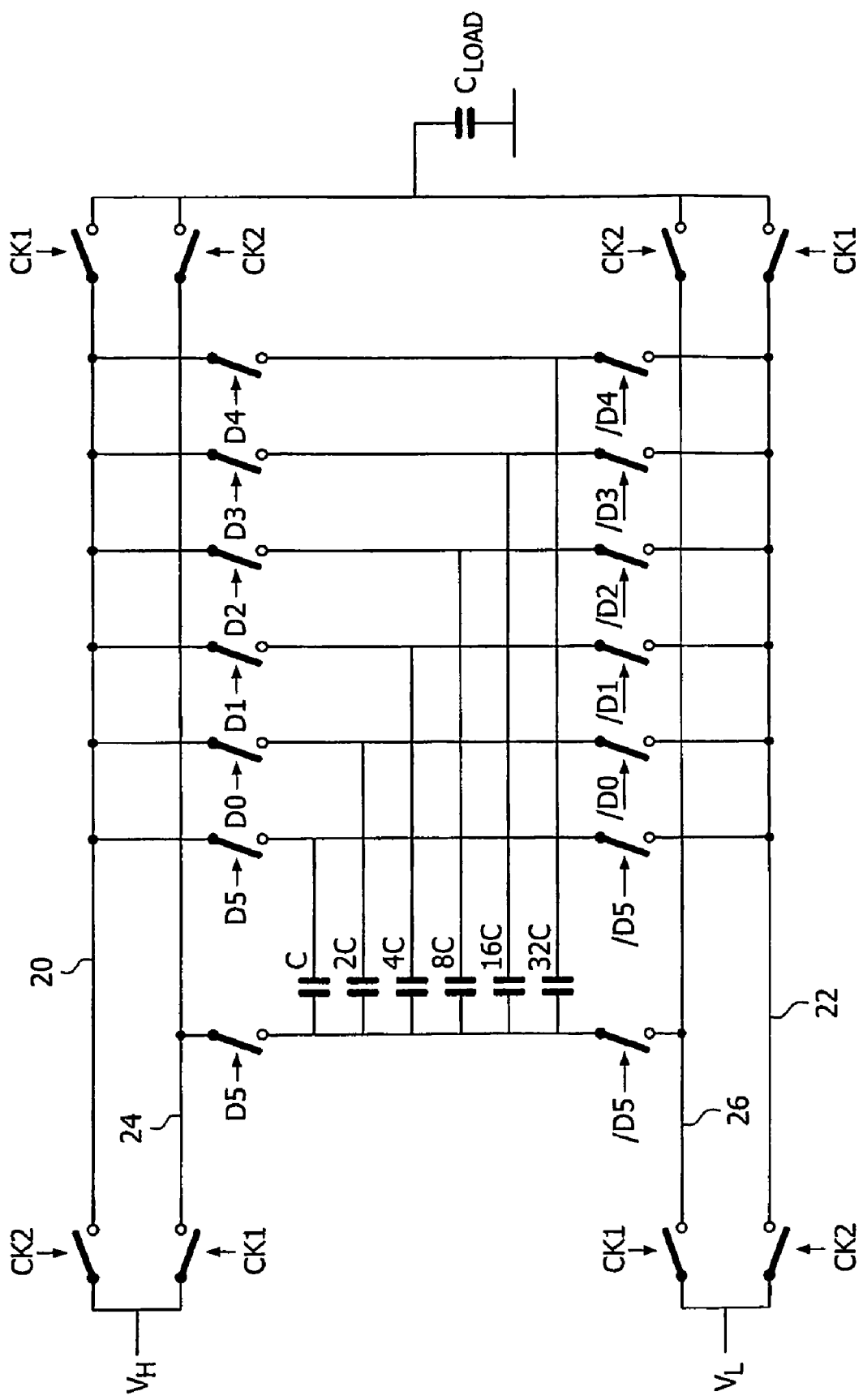
FIG. 14 shows a fourth digital to analogue converter circuit of the invention.

In the circuit of FIG. 14, the data input signals for the circuit are provided in a different manner. The topology of the circuit of FIG. 14 is different, but the connections made by the combined operation of all of the switches is functionally identical to the previous embodiments.

In FIG. 14, a plurality of capacitor circuits each comprise an input switch and an output switch in series between a first power line 20 and a second power line 22. The first power 20 line is selectively connected (by CK2) to the high binary voltage level VH, and the second power line 22 is selectively connected to the low binary voltage level VL (also by CK2). A capacitor is connected between the junction between the input switch and output switch and a common terminal. The first power 20 line is selectively connected (by CK1) to the output load, and the second power line 22 is selectively connected (also by CK1) to the output load.

In this arrangement, the input switches are each controlled by a respective digital input D0-D5 and the output switches are each controlled by the complement of the respective digital input /D0-/D5.

An additional input switch and an additional output switch are provided in series between a third power line 24 and a fourth power line 26, and the additional input switch and additional output switch are controlled by the most significant bit D5 and /D5 of the digital input. The common terminal is defined at the junction between the additional input switch and the additional output switch. The third and fourth power lines 24, 26 are connected to respective binary voltage levels by CK1 and to the output load by CK2.

It can be seen that the circuit provides the same functionality. In particular, CK2 controls when the common terminal is connected to the output load and CK1 controls when the common terminal is connected to a binary input voltage, as in FIG. 12. CK1 controls when a capacitor terminal (not the common terminal) is connected to the output load and CK2 controls when that capacitor terminal is connected to a binary input voltage, as in FIG. 12.

The pairs of switches D and /D control which binary voltage is provided to the capacitor terminal (through CK2) and these perform the function of the bank of input switches in FIG. 13.

This arrangement has the advantage that only eight of the switches are controlled by the clocks CK1 and CK2 and the total number of switches is 2N+10.

While this circuit has a quite different arrangement of switches compared to the previous circuits, the sequence in which the capacitors are connected to the binary voltage levels, VH and VL, and the output node is exactly the same as in the previous circuits, as explained above.

The techniques illustrated here could also be applied to other digital to analogue converter circuits which make use of arrangements of switched capacitor resistors.

This technique is of particular interest for the integrated column drive circuits of AMLCDs. The converter circuits have a relatively low output resistance, and this low output resistance can avoid the need for an output amplifier/buffer.

Figure 15:
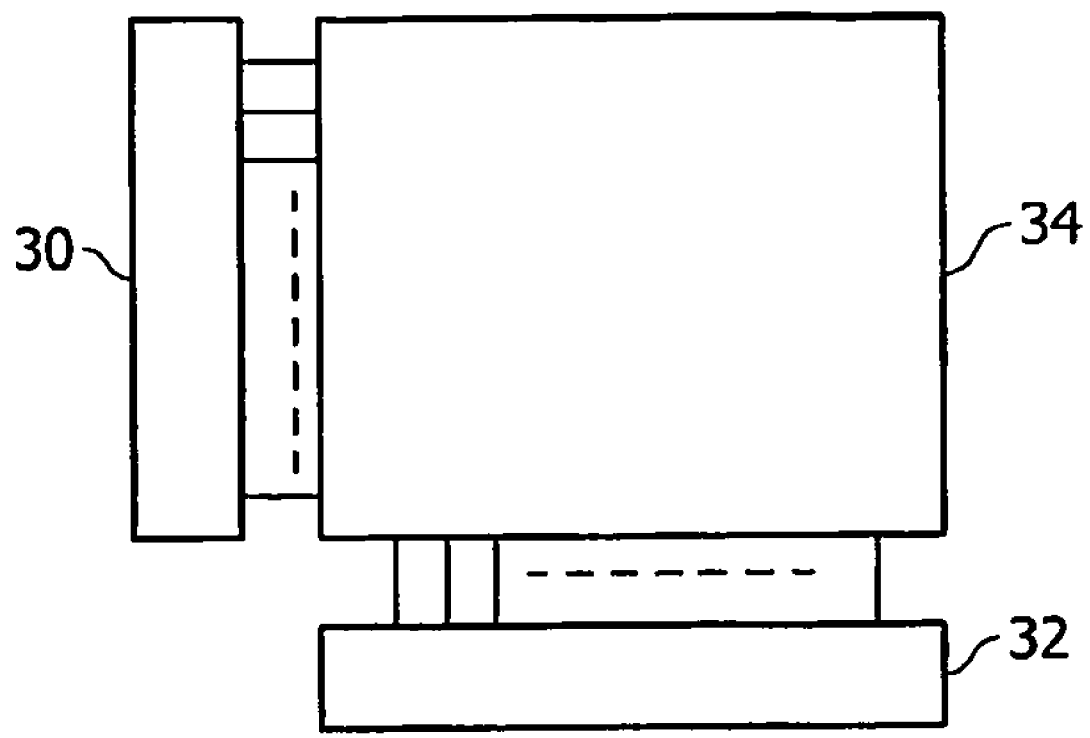
FIG. 15 shows a display device of the invention.

FIG. 15 shows a display device of the invention, which comprises row driver circuitry 30 for providing signals to the rows of pixels in a pixel array 34, column address circuitry 32 providing pixel drive signals to the columns of pixels in the array.

The column address circuitry 32 includes a digital to analogue converter of the invention, and this can provide signals directly to the column conductors without the need for intermediate buffers or amplifiers. The components of the converter are also suitable for integration onto the substrate carrying the display pixels.

The converters shown are 6 bit converters. It will be immediately apparent that the invention can be applied to other size converters. Equally, there are many other specific converter circuits which can be modified by using the capacitor circuits of the invention, which form the building blocks for the converters of the invention.

Various other modifications will be apparent to those skilled in the art.

The invention claimed is:

1. A digital to analogue converter comprising:
a plurality of digital inputs corresponding in number to the number of bits of a digital input word, the inputs being used to select one of first and second binary voltage levels as binary inputs to the converter;
a respective capacitor circuit associated with each input;
first and second clock inputs;
an output load; and
a plurality of switches controlled by the clock inputs for controlling the coupling of the capacitor circuits either to one of the binary inputs or to the output load,
wherein each of the capacitor circuits is controllable to output an effective voltage to the load, the effective voltage being selectable from at least three voltage levels comprising the first binary voltage level, the second binary voltage level or an average of the first and second binary voltage levels in dependence on the bits of the digital input word.

2. A converter as claimed in claim 1, wherein each capacitor circuit comprises an input circuit, having:
a first branch between a first input and the output and comprising first and second switches in series;
a second branch between a second input and the output and comprising third and fourth switches in series;
a capacitor connected between the junction between the first and second switches and the junction between the third and fourth switches.

3. A converter as claimed in claim 2, wherein the first and fourth switches are clocked by the first clock input and the second and third switches are clocked by the second clock input.

4. A converter as claimed in claim 3, wherein the first and second clock inputs are complementary signals.

5. A converter as claimed in claim 2, wherein each input circuit further comprises a first switching arrangement for supplying a first selected one of the binary voltage levels to the first input and a second switching arrangement for supplying a second selected one of the binary voltage levels to the second input.

6. A converter as claimed in claim 5, wherein the first and second switching arrangements of each of said plurality of the input circuits are controllable to provide the first binary voltage level to the first and second inputs, to provide the second binary voltage level to the first and second inputs, or to provide the first binary voltage level to one input and the second binary level to the other input.

7. A converter as claimed in claim 1, wherein the plurality of the capacitor circuits comprises all of the capacitor circuits in the digital-to-analog converter except for one of the capacitor circuits.

8. A converter as claimed in claim 7, wherein said one capacitor circuit is controlled by the most significant bit of the digital input word.

9. A converter as claimed in claim 8, wherein said one capacitor circuit is controllable to output an effective voltage comprising only the first binary voltage level or the second binary voltage level.

10. A converter as claimed in claim 1, wherein the capacitor circuits are connected in parallel between the plurality of inputs and the capacitive output load.

11. A converter as claimed in claim 1, wherein each of the capacitor circuits comprises an input switch and an output switch in series between one of the binary inputs and the output load, and further comprising a capacitor connected between the junction between the input switch and output switch and a common terminal.

12. A converter as claimed in claim 11, wherein each input switch is controlled by the first clock input and each output switch is controlled by the second clock input.

13. A converter as claimed in claim 12, further comprising an additional input switch and an additional output switch in series between the binary input associated with the most significant bit and the output load, the common terminal being defined at the junction between the additional input switch and the additional output switch.

14. A converter as claimed in claim 13, wherein the additional input switch is controlled by the second clock input and the additional output switch is controlled by the first clock input.

15. A converter as claimed in claim 1, wherein each of the capacitor circuits comprises an input switch and an output switch in series between a first power line and a second power line, wherein the first power line is selectively connected to the first binary voltage level and the second power line is selectively connected to the second binary voltage level, and further comprising a capacitor connected between the junction between the input switch and output switch and a common terminal.

16. A converter as claimed in claim 15, wherein the input switches are each controlled by a respective digital input and the output switches are each controlled by the complement of the respective digital input.

17. A converter as claimed in claim 16, wherein the first and second power lines are connected to the first and second binary voltage levels under the control of one of the clock inputs, and the first and second power lines are connected to the output load under the control of the other one of the clock inputs.

18. A converter as claimed in claim 15, further comprising an additional input switch and an additional output switch in series between a third power line and a fourth power line, the additional input switch and additional output switch are controlled by the most significant bit of the digital input, and the common terminal is defined at the junction between the additional input switch and the additional output switch.

19. A converter as claimed in claim 18, wherein the third and fourth power lines are connected to the first and second binary voltage levels under the control of the other of the clock inputs, and the third and fourth power lines are connected to the output load under the control of the one of the clock inputs.

20. A converter as claimed in claim 1, wherein each capacitor circuit has an effective resistance determined by the capacitance.

21. A converter as claimed in claim 20, wherein the capacitor circuits have effective resistances such that they form a binary weighted circuit configuration.

22. A converter as claimed in claim 21, wherein the capacitor circuit with greatest effective resistance is controlled by the most significant bit of the digital input word, and the other capacitor circuits are each controlled by the most significant bit of the digital input word and one respective other bit of the digital input word.

23. A converter as claimed in claim 22, wherein:
the capacitor circuit with greatest effective resistance is controlled effectively to output either the first binary voltage level or the second binary voltage level in dependence on the most significant bit; and
each of the other capacitor circuits are controlled effectively to output:
either the second binary voltage level or the average of the first and second binary voltage levels when the most significant bit of the digital input word is high, in dependence on the respective other bit; or
either the first binary voltage level or the average of the first and second binary voltage levels when the most significant bit of the digital input word is tow, in dependence on the respective other bit.

24. A converter as claimed in claim 1, wherein the capacitor circuits are connected in parallel between the plurality of inputs and junctions of a resistor chain (R), a first end of the resistor chain being connected to the output load.

25. A converter as claimed in claim 24, wherein the capacitor circuits have the same effective resistances.

26. A converter as claimed in claim 25, wherein the capacitor circuit at the second end of the resistor chain is controlled by the most significant bit of the digital input word, and the other capacitor circuits are each controlled by the most significant bit of the digital input word and one respective other bit of the digital input word.

27. A converter as claimed in claim 26, wherein:
the capacitor circuit at the second end of the resistor chain is controlled effectively to output either the first binary voltage level or the second binary voltage level in dependence on the most significant bit; and
each of the other capacitor circuits are controlled effectively to output:
either the second binary voltage level or the average of the first and second binary voltage levels when the most significant bit of the digital input word is high, in dependence on the respective other bit; or
either the first binary voltage level or the average of the first and second binary voltage levels when the most significant bit of the digital input word is low, in dependence on the respective other bit.

28. A converter as claimed in claim 25, wherein an average of the first and second binary voltage levels is coupled to the second end of the resistor chain through an effective resistance corresponding to the capacitor circuit effective resistance.

29. A converter as claimed in claim 28, wherein the average of the first and second binary voltage levels is coupled to the second end of the resistor chain by a further capacitor circuit.

30. A method of performing digital to analogue conversion, comprising:
using the bits of a digital input word to generate a plurality of control voltages corresponding in number to the number of bits, one control voltage comprising a first binary voltage level or a second binary voltage level, and each other control voltage being selectable from at least three voltage levels comprising a first binary voltage level, a second binary voltage level or an average of the first and second binary voltage levels; and
using the plurality of control voltages to drive an output load.

31. A method as claimed in claim 30, wherein generating a plurality of control voltage comprises operating a switched capacitor resistor circuit.

32. A method as claimed in claim 30, wherein generating a plurality of control voltage comprises operating a plurality of switched capacitor resistor circuits each having two control inputs, wherein one of the first and second binary voltage levels is applied to the first control input and one of the first and second binary voltage levels is applied to the second control input.

33. A display device comprising:
an array of display pixels;
row driver circuitry for providing signals to the rows of pixels; and
column address circuitry providing pixel drive signals to the columns of pixels, wherein the column address circuitry comprises a digital to analogue converter as claimed in claim 1.

* * * * *